United States Patent
Zhang et al.

(10) Patent No.: US 11,356,612 B2
(45) Date of Patent: Jun. 7, 2022

(54) ELECTRONIC DEVICE

(71) Applicant: GUANGDONG OPPO MOBILE TELECOMMUNICATIONS CORP., LTD., Guangdong (CN)

(72) Inventors: Xiang Zhang, Guangdong (CN); Zanjian Zeng, Guangdong (CN); Kai Gao, Guangdong (CN); Wuchun Zeng, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 210 days.

(21) Appl. No.: 16/887,625

(22) Filed: May 29, 2020

(65) Prior Publication Data

US 2020/0296293 A1    Sep. 17, 2020

Related U.S. Application Data

(63) Continuation of application No. PCT/CN2018/121248, filed on Dec. 14, 2018.

(30) Foreign Application Priority Data

Jan. 19, 2018  (CN) .......................... 201810054793.3
Jan. 19, 2018  (CN) .......................... 201810055280.4
Jan. 19, 2018  (CN) .......................... 201810055289.5

(51) Int. Cl.
*H05K 7/00* (2006.01)
*H04N 5/232* (2006.01)
(Continued)

(52) U.S. Cl.
CPC ......... *H04N 5/23299* (2018.08); *F16H 1/203* (2013.01); *F16H 19/04* (2013.01);
(Continued)

(58) Field of Classification Search
CPC ............ H04N 5/23299; H04N 5/2253; H04N 5/2257; F16H 1/203; F16H 19/04;
(Continued)

(56) References Cited

U.S. PATENT DOCUMENTS

2002/0018134 A1   2/2002  Tsukahara et al.
2006/0261257 A1  11/2006  Hwang
(Continued)

FOREIGN PATENT DOCUMENTS

CN   2717138    8/2005
CN   1725775    1/2006
(Continued)

OTHER PUBLICATIONS

WIPO, ISR for PCT/CN2018/121248, dated Mar. 7, 2019.
(Continued)

*Primary Examiner* — Andargie M Aychillhum
(74) *Attorney, Agent, or Firm* — Hodgson Russ LLP

(57) ABSTRACT

The embodiments of the present application provide an electronic device, the electronic device defines a channel. A driving board is fixedly connected with a camera module, and an output shaft of a driving motor is mounted with a driving gear. A driven gear is meshed with both of the driving gear and a rack, a diameter of the driven gear is greater than a diameter of the driving gear. The driving motor can drive the driving board to move along a direction from the channel to the outside of the electronic device through the rotation of the driving gear and the rotation of the driven gear, thereby to drive the camera module from in the channel to the outside of the electronic device.

19 Claims, 8 Drawing Sheets

(51) Int. Cl.
    *F16H 1/20* (2006.01)
    *F16H 19/04* (2006.01)
    *H04N 5/225* (2006.01)
    *H05K 5/00* (2006.01)
    *H05K 5/03* (2006.01)

(52) U.S. Cl.
    CPC ......... *H04N 5/2253* (2013.01); *H04N 5/2257* (2013.01); *H05K 5/0004* (2013.01); *H05K 5/0017* (2013.01); *H05K 5/0086* (2013.01); *H05K 5/03* (2013.01)

(58) Field of Classification Search
    CPC .. H05K 5/0004; H05K 5/0017; H05K 5/0086; H05K 5/03
    USPC .......................................................... 361/760
    See application file for complete search history.

(56) References Cited

U.S. PATENT DOCUMENTS

| | | | | |
|---|---|---|---|---|
| 2016/0147293 | A1* | 5/2016 | Park | G06F 1/1694 381/334 |
| 2017/0229823 | A1* | 8/2017 | Tsai | H01R 24/60 |

FOREIGN PATENT DOCUMENTS

| | | | |
|---|---|---|---|
| CN | 2807637 | | 8/2006 |
| CN | 201011733 | | 1/2008 |
| CN | 201107527 | | 8/2008 |
| CN | 101330246 | | 12/2008 |
| CN | 101500377 | | 8/2009 |
| CN | 201440669 | | 4/2010 |
| CN | 103533222 | | 1/2014 |
| CN | 103533222 A | * | 1/2014 |
| CN | 103546687 | | 1/2014 |
| CN | 203532930 | | 4/2014 |
| CN | 203661172 | | 6/2014 |
| CN | 203984539 | | 12/2014 |
| CN | 204652455 | | 9/2015 |
| CN | 105049686 | | 11/2015 |
| CN | 105872339 | | 8/2016 |
| CN | 106272210 A | * | 1/2017 |
| CN | 205864572 | | 1/2017 |
| CN | 205945718 | | 2/2017 |
| CN | 206092825 | | 4/2017 |
| CN | 106640940 | | 5/2017 |
| CN | 107448093 | | 12/2017 |
| CN | 207166546 | | 3/2018 |
| CN | 108512953 | | 9/2018 |
| KR | 20170038179 | | 4/2017 |

OTHER PUBLICATIONS

SIPO, First Office Action for CN Application No. 201810055289.5, dated Dec. 3, 2019.
SIPO, Second Office Action for CN Application No. 201810055289.5, dated Apr. 3, 2020.
SIPO, First Office Action for CN Application No. 201810055280.4, dated Dec. 2, 2019.
SIPO, First Office Action for CN Application No. 201810054793.3, dated Nov. 19, 2019.
CNIPA, Notification to Grant Patent Right for Invention for CN Application No. 201810055289.5, dated Aug. 13, 2021.
IPI, Office Action for IN Application No. 202017022264, dated Jun. 29, 2021.
EPO, Search Report for EP Application No. 18901796.5, dated Dec. 23, 2020.
SIPO, Second Office Action for CN Application No. 201810054793.3, dated Mar. 30, 2020.
SIPO, Decision of Rejection for CN Application No. 201810054793.3, dated May 27, 2020.
SIPO, Second Office Action for CN Application No. 201810055280.4, dated Apr. 2, 2020.
SIPO, Decision of Rejection for CN Application No. 201810055280.4, dated May 29, 2020.
SIPO, Decision of Rejection for CN Application No. 201810055289.5, dated Jun. 18, 2020.

* cited by examiner

ELECTRONIC DEVICE

CROSS-REFERENCE TO RELATED APPLICATIONS

This application is a continuation of International Application No. PCT/CN2018/121248 filed Dec. 14, 2018, which claims priority to Chinese Patent Application Nos. 201810055289.5, 201810055280.4 and 201810054793.3, each of which were filed Jan. 19, 2018. The entire disclosures of each of the aforementioned applications are incorporated herein by reference.

TECHNICAL FIELD

The present disclosure relates to a field of electronic device, and particularly to an electronic device.

BACKGROUND

With the development of communication technology, electronic devices such as smart phones have been widely used in daily lives. In the use of electronic device, for example, camera is used to take photos. In order to realize the convenience of taking photos, the existing electronic device generally has front-facing camera and rear-facing camera, and the two cameras can be installed in the electronic device to take photos in front and back. However, the front-facing camera and the rear-facing camera mounted in the electronic device are fixed in direction, so it is still inconvenient when taking pictures.

SUMMARY

The embodiments of the present application provide an electronic device, which can improve the convenience of taking photos of the electronic device.

In a first aspect, the embodiments of the present application provide an electronic device, including a camera module and a driving device and defining a channel, and the driving device includes:

a driving board, fixedly connected with the camera module and including a rack;

a driving motor, including an output shaft mounted with a driving gear; and a driven gear, meshed with both of the driving gear and the rack, wherein a diameter of the driven gear is greater than a diameter of the driving gear;

wherein the driving motor can drive the driving board to move along a direction from the channel to the outside of the electronic device through the rotation of the driving gear and the rotation of the driven gear, thereby to drive the camera module from in the channel to the outside of the electronic device.

In a second aspect, the embodiments of the present application provide an electronic device, including a camera module and a driving device and defining a channel, and the driving device includes:

a driving board, fixedly connected with the camera module and including a rack;

a driving motor, including an output shaft mounted with a driving gear; and a driven gear, meshed with both of the driving gear and the rack, wherein the driven gear and the driving board are arranged side by side in a first direction, the driven gear, the driving board and the driving motor are arranged side by side in a second direction, the first direction is perpendicular to the second direction, and a diameter of the driven gear is greater than a diameter of the driving gear;

wherein the driving motor can drive the driving board to move along a direction from the channel to the outside of the electronic device through the rotation of the driving gear and the rotation of the driven gear, thereby drive the camera module from the channel to the outside of the electronic device.

In a third aspect, the embodiments of the present application provide an electronic device, including a camera module and a driving device and defining a channel, and the driving device includes:

a driving board, fixedly connected with the camera module, and including a rack;

a driving motor, including an output shaft mounted with a driving gear; and a driven gear, meshed with both of the driving gear and the rack, wherein the driven gear is located between the driving board and the driving motor, the driving motor is perpendicular to the driving board, a diameter of the driven gear is greater than a diameter of the driving gear;

wherein the driving motor can drive the driving board to move along a direction from the channel to the outside of the electronic device through the rotation of the driving gear and the rotation of the driven gear, thereby to drive the camera module from in the channel to the outside of the electronic device.

BRIEF DESCRIPTION OF THE DRAWINGS

In order to explain the technical solution in the embodiments of the present application more clearly, the drawings used in the description of the embodiments will be briefly introduced below. It is obvious that the drawings in the following description are only some embodiments of the application. For those skilled in the art, without any creative work, other drawings can be obtained based on these drawings.

DETAILED DESCRIPTION

Figure 1:
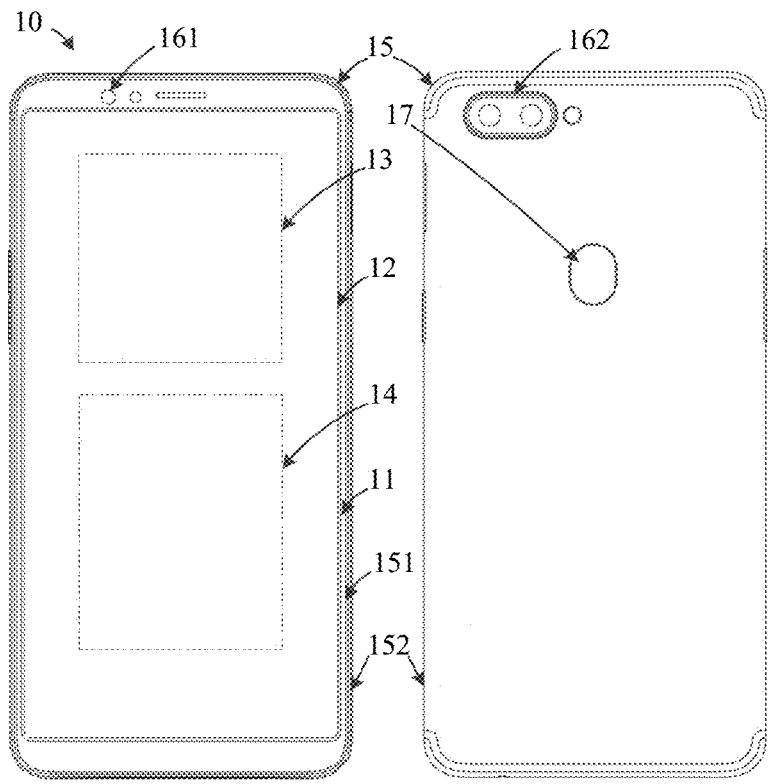
FIG. 1 is a structural schematic view of an electronic device according to embodiments of the present application.

The technical solutions in the embodiment of the application will be described clearly and completely below in combination with the drawings in the embodiments of the application. Obviously, the described embodiments are only one part of the embodiments of the application, not all of the embodiments. Based on the embodiments in the application, all other embodiments obtained by those skilled in the art without creative labor belong to the scope of protection of the application.

The below disclosure provides many different embodiments or examples for implementing different structures of the present application. In order to simplify the disclosure of the present application, the components and settings of particular examples are described below. Of course, they are only examples and are not intended to limit the application.

The embodiments of the application provide an electronic device, which can be a smart phone, a tablet computer and other devices.

The electronic device in the embodiments of the application includes a camera module and a driving device and defining a channel, and the driving device includes:

a driving board, fixedly connected with the camera module and including a rack;

a driving motor, including an output shaft mounted with a driving gear; and a driven gear, meshed with both of the driving gear and the rack, wherein a diameter of the driven gear is greater than a diameter of the driving gear;

wherein the driving motor can drive the driving board to move along a direction from the channel to the outside of the electronic device through the rotation of the driving gear and the rotation of the driven gear, thereby to drive the camera module from in the channel to the outside of the electronic device.

In some embodiments, the driving device further includes at least one transmission gear, the at least one transmission gear is meshed with the driving gear, a diameter of the transmission gear is greater than a diameter of the driving gear; and the transmission gear is meshed with the driven gear, and a diameter of the transmission gear is smaller than a diameter of the driven gear.

In some embodiments, the at least one transmission gear includes a first transmission gear and a second transmission gear, a diameter of the first transmission gear is smaller than a diameter of the second transmission gear; the first transmission gear is meshed with the driving gear, and the diameter of the first transmission gear is greater than the diameter of the driving gear; the second transmission gear is meshed with the driven gear, and the diameter of the second transmission gear is smaller than the diameter of the driven gear.

In some embodiments, the first transmission gear, the second transmission gear and the driven gear each are located between the driving motor and the driving board.

In some embodiments, the first transmission gear, the second transmission gear and the driven gear are arranged in a direction inclined to the driving board.

In some embodiments, the axes of the first transmission gear, the second transmission gear and the driven gear are connected to form an arc-shaped structure. That is, the axes of the first transmission gear, the second transmission gear and the driven gear are arranged in an arc shape.

In some embodiments, the driving motor is located in the concave position of the arc-shaped structure, and one side of the driving motor is surrounded by the first transmission gear, the second transmission gear and the driven gear. That is, the driving motor is located in the concave position of the arc shape.

In some embodiments, the projection formed by the driving motor on the driving board is located in the projection formed on the driving board by both the second transmission gear and the driven gear.

In some embodiments, the driving motor and the driving board are parallel to each other.

In some embodiments, the diameter of the first transmission gear is greater than 1.8 mm and less than 2.2 mm, the diameter of the second transmission gear is greater than 3.8 mm and less than 4.2 mm, the diameter of the driven gear is greater than 5.8 mm and less than 6.2 mm, and the diameter of the driving motor is greater than 4.8 mm and less than 5.2 mm.

In some embodiments, the first transmission gear is fixedly connected with a worm, and the worm is meshed with the driving gear.

In some embodiments, the electronic device includes a side wall at the channel position, the electronic device includes a waterproof gasket, and the waterproof gasket is installed on the side wall.

In some embodiments, the electronic device includes a display screen, the driving device drives the driving board to move in a direction perpendicular to the display screen.

In some embodiments, the channel is defined from the side opposite to the display surface of the display screen towards the display surface of the display screen.

In some embodiments, the electronic device also includes a moving device connected with the camera module, and the moving device is configured to move the camera module outside the electronic device to an outer periphery of the electronic device.

In some embodiments, the electronic device includes a display screen, and the driving device drives the driving board to move in a direction parallel to the display screen.

In some embodiments, the electronic device further includes a moving device connected with the camera module, and the moving device is configured to control the rotation of the camera module outside the electronic device.

In some embodiments, the electronic device also includes a processor electrically connected to the driving motor, the processor is configured to control the driving motor to drive the rotation of the driving gear.

The electronic device in the embodiments of the application includes a camera module and a driving device and defining a channel, and the driving device includes:

a driving board, fixedly connected with the camera module and including a rack;

a driving motor, including an output shaft mounted with a driving gear; and a driven gear, meshed with both of the driving gear and the rack, wherein the driven gear and the driving board are arranged side by side in a first direction, the driven gear, the driving board and the driving motor are arranged side by side in a second direction, the first direction is perpendicular to the second direction, and a diameter of the driven gear is greater than a diameter of the driving gear;

wherein the driving motor can drive the driving board to move along a direction from the channel to the outside of the electronic device through the rotation of the driving gear and the rotation of the driven gear, thereby drive the camera module from the channel to the outside of the electronic device.

In some embodiments, the driving device further includes at least one transmission gear, the at least one transmission gear includes a first transmission gear and a second transmission gear, a diameter of the first transmission gear is smaller than a diameter of the second transmission gear; the first transmission gear is meshed with the driving gear, and the diameter of the first transmission gear is greater than the diameter of the driving gear; the second transmission gear is meshed with the driven gear, and the diameter of the second transmission gear is smaller than the diameter of the driven gear, the first driving transmission gear, the second transmission gear and the driven gear are arranged in a direction parallel to the driving board.

In some embodiments, the diameter d1 of the first transmission gear is greater than 1.8 mm and smaller than 2.2 mm, the diameter d2 of the second transmission gear is greater than 3.8 mm and smaller than 4.2 mm, the diameter d3 of the driven gear is greater than 5.8 mm and smaller than 6.2 mm, and the diameter d4 of the driving motor is greater than 4.8 mm and smaller than 5.2 mm.

The electronic device in the embodiments of the application includes a camera module and a driving device and defining a channel, and the driving device includes:

a driving board, fixedly connected with the camera module, and including a rack;

a driving motor, including an output shaft mounted with a driving gear; and a driven gear, meshed with both of the driving gear and the rack, wherein the driven gear is located between the driving board and the driving motor, the driving motor is perpendicular to the driving board, a diameter of the driven gear is greater than a diameter of the driving gear;

wherein the driving motor can drive the driving board to move along a direction from the channel to the outside of the electronic device through the rotation of the driving gear and the rotation of the driven gear, thereby to drive the camera module from in the channel to the outside of the electronic device.

In some embodiments, the driving device further includes at least one transmission gear, the at least one transmission gear includes a first transmission gear and a second transmission gear, a diameter of the first transmission gear is smaller than a diameter of the second transmission gear; the first transmission gear is meshed with the driving gear, and the diameter of the first transmission gear is greater than a diameter of the driving gear; the second transmission gear is meshed with the driven gear, and the diameter of the second transmission gear is smaller than a diameter of the driven gear, the first transmission gear, the second transmission gear and the driven gear each are located between the driving motor and the driving board, and the first transmission gear, the second transmission gear and the driven gear are arranged in a direction perpendicular to the driving board.

In some embodiments, the diameter d1 of the first transmission gear is greater than 1.8 mm and smaller than 2.2 mm, the diameter d2 of the second transmission gear is greater than 3.8 mm and smaller than 4.2 mm, the diameter d3 of the driven gear is greater than 5.8 mm and smaller than 6.2 mm, and the diameter d4 of the driving motor is greater than 4.8 mm and smaller than 5.2 mm.

Referring to FIG. 1, which is a structural schematic view of the electronic device provided in the embodiments of the present disclosure. The electronic device 10 can include a cover plate 11, a display screen 12, a circuit board 13, a battery 14, a housing 15, a front-facing camera 161, a rear-facing camera 162 and a fingerprint unlocking module 17. It should be noted that the electronic device 10 shown in FIG. 1 is not limited to the above, and can also include other components, or exclude the front-facing camera 161, or exclude the rear-facing camera 162, or exclude the fingerprint unlocking module 17 and so on.

Wherein, the cover plate 11 is installed on the display screen 12 to cover the display screen 12. The cover plate 1 can be a transparent glass cover plate, so that the display screen displays through the cover plate 11. In some embodiments, the cover plate 11 can be a glass cover plate made of a material such as sapphire.

In the description of the present application, it should be noted that unless otherwise specified and defined, the terms "install", "linked" and "connection" should be understood in a broad sense, for example, it can be a fixed connection, a detachable connection, or an integrated connection; it can be a mechanical connection, an electrical connection or mutual communications; it can be directly connected, or indirectly connected through intermediate media, it can also be the internal connection of two components or the interaction relationship between two components. For those of ordinary skill in the art, the specific meaning of the above terms in the application can be understood according to the specific situation.

In the present disclosure, unless otherwise specified and defined, the first feature is "on" or "under" the second feature can include direct contact of the first feature and second feature, or it can include contact of the first feature and second feature through other features between them instead of direct contact. Moreover, the first feature is "on", "above", and "over" the second feature, including the first feature is directly above and obliquely above the second feature, or only indicates that the first feature has a higher level than the second feature. The first feature is "below", "under", and "lower" of the second feature, including the fact that the first feature is directly below and obliquely below the second feature, or only indicates that the first feature has a lower level than the second feature.

Wherein, the housing 15 can form an outer contour of the electronic device 10. In some embodiments, the housing 15 can include a middle frame 151 and a rear cover 152, wherein the middle frame 151 and the rear cover 152 are combined to form the housing 15, and the middle frame 151 and the rear cover 152 can form a storage space to receive components such as the printed circuit board 13, the display screen 12, the battery 14 and so on. Further, the cover plate 11 can be fixed on the housing 15, and the cover plate 11 and the housing 15 form a closed space to accommodate components such as the printed circuit board 13, the display screen 12, the battery 14 and so on. In some embodiments, the cover plate 11 is covered on the middle frame 151, and the rear cover 152 is covered on the middle frame 151, the cover plate 11 and the rear cover 152 are located on the opposite sides of the middle frame 151, and the cover plate 11 and the rear cover 152 are oppositely disposed.

In some embodiments, the housing 15 can be made of a metal material, such as magnesium alloy, stainless steel and other metals. It should be noted that the material of the housing 15 in the embodiments of the application is not limited to this, and other materials can be adopted, for example, the housing 15 can be a plastic housing. For another example, the housing 15 is a ceramic housing. For another example, the housing 15 can include a plastic part and a metal part, the housing 15 can be a housing structure with metal and plastic, specifically, the metal part can be formed first, for example, a magnesium alloy substrate can be formed by injection molding, then a plastic can be injection molded on the magnesium alloy substrate to form a plastic substrate, thus a housing structure is formed completely. It should be noted that the material and process of the housing 15 are not limited to this, and a glass housing can also be used.

It should be noted that the structure of the housing of the embodiment of the application is not limited to this, for example, the rear cover and the middle frame are integrally formed to form a completed housing 15 structure, and the housing directly has a storage space for receiving components such as the printed circuit board 13, the display screen 12, the battery 14 and so on.

Wherein, the printed circuit board 13 is installed in the housing 15. The printed circuit board 13 can be the main board of the electronic device 10, and the printed circuit board 13 can be integrated with one or two or multiple functional components such as a motor, a microphone, a loudspeaker, a headphone interface, an universal serial bus interface, the front-facing camera 161, the rear-facing camera 162, a distance sensor, an ambient light sensor, a handset, a processor and so on. It should be noted that in the description of the application, unless otherwise specified, "multiple" means two or more.

In some embodiments, the printed circuit board 13 can be fixed in the housing 15. Specifically, the printed circuit board 13 can be screwed to the middle frame 151 by at least one screw, or can be fitted to the middle frame 151 by at least one snap. It should be noted that the method for fixing the printed circuit board 13 to the middle frame 151 in the embodiments of the present application is not limited to this, and can also be other methods, such as a joint fixing by the snap and the screw.

Among them, the battery 14 is installed in the housing 15 and electrically connected with the printed circuit board 13 to provide power to the electronic device 10. The housing 15 can serve as a battery cover for the battery 14. The housing 15 covers the battery 14 to protect the battery 14, specifically, the rear cover covers the battery 14 to protect the battery 14 and reduce the damage to the battery 14 due to the collision, fall, and the like of the electronic device 10.

Wherein, the display screen 12 is installed in the housing 15, while the display screen 12 is electrically connected to the printed circuit board 13 to form a display surface of the electronic device 10. The display screen 12 can include a display area and a non-display area. The display area can be used to display a screen of the electronic device 10 or for the user to perform touch control and so on. The top area of the non-display area is defined with at least one hole for sound transmission and light transmission, and the bottom of the non-display area can be provided with functional components such as a fingerprint module and a touch button. The cover plate 11 is installed on the display screen 12 to cover the display screen 12, which can form the same display area and non-display area as the display screen 12, and can also form different display areas and non-display areas from the display screen 12.

In some embodiments, the display screen 12 can be a liquid crystal display (LCD) or an organic light emitting diode (OLED) or the like. In some embodiments, when the display screen 12 is a LCD, the display screen 12 can include a backlight module, a lower polarizing sheet, an array substrate, a liquid crystal layer, a color film substrate, an upper polarizing sheet and other structures which are sequentially stacked. When the display screen 12 is OLED, the display screen 12 can include a base layer, an anode layer, an organic layer, a conductive layer, an emitting layer, a cathode layer and other structures which are sequentially stacked. In some embodiments, the display screen 12 can be a transparent display screen, which can have a transparent property for signal to pass through. The display can also be a non-transparent display.

It should be noted that the structure of the display 12 is not limited to this. For example, the display 12 can be a special-shaped screen.

Figure 2:
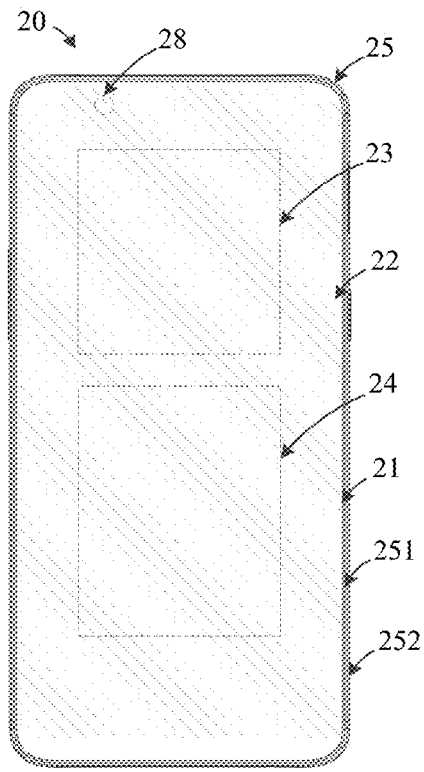
FIG. 2 is another structural schematic view of an electronic device according to embodiments of the present application.

Please refer to FIG. 2, which is another structural view of the electronic device provided in the embodiments of the present application. The electronic device in FIG. 2 differs from the electronic device in FIG. 1 in that the electronic device 20 includes a display screen 22, a cover plate 21, a printed circuit board 23, a battery 24, and a housing 25. A light-transmitting area 28 of the display screen 22 is directly defined on the display screen 22. Specifically, for example, the display screen 22 is provided with a through hole penetrating the display screen 22 in the thickness direction, and the light-transmitting area 28 can include the through hole, and the position of the through hole can be configured to dispose functional components such as the front-facing camera 161, a handset, a sensor and so on.

It should be noted that the structure of the display screen is not limited to this, for example, the display screen 22 is defined with a non-display area, the light-transmitting area 28 can include the non-display area, and the non-display area cannot be displayed. It should be noted that the housing 25 can refer to the above housing 15, the printed circuit board 23 can refer to the above printed circuit board 13, and the battery 24 can refer to the above battery 14, and details will not be described herein again.

Figure 3:
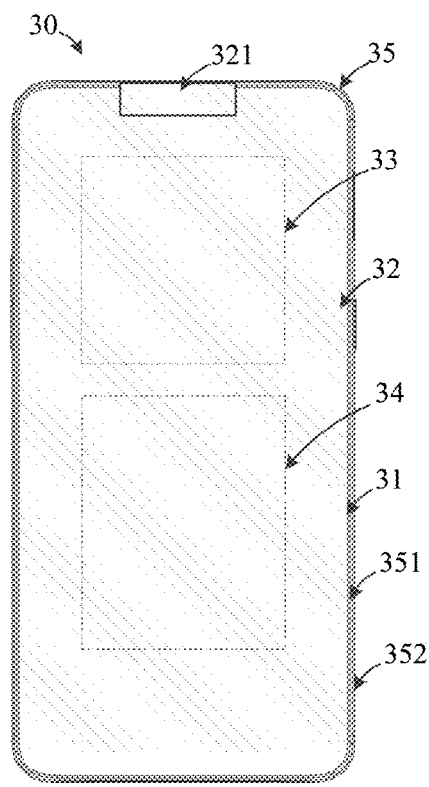
FIG. 3 is a structural schematic view of another electronic device according to embodiments of the present application.

Please refer to FIG. 3, which is the structural view of another electronic device provided by the embodiment of present application. The difference between the electronic device in FIG. 3 and the electronic device in FIG. 1 is that the electronic device 30 in FIG. 3 can include a display screen 32, a cover plate 31, a printed circuit board 33, a battery 34 and a housing 35. Wherein, the display screen 32 is defined with a notch 321 around it, and the notch 321 can be configured to place functional components such as the front-facing camera 161, the handset, the sensor and so on. Wherein, the cover plate 31 is suitable for the structure setting of the display screen 31. The cover plate 31 can be defined with an equal large notch corresponding to the position of the notch 321, and the cover plate 31 can also cover the position of the notch 321. It should be noted that the housing 35 can be referred to the above housing 15, the printed circuit board 33 can be referred to the above printed circuit board 13, and the battery 34 can be referred to the above battery 14, and details will not be discussed here.

Figure 4:
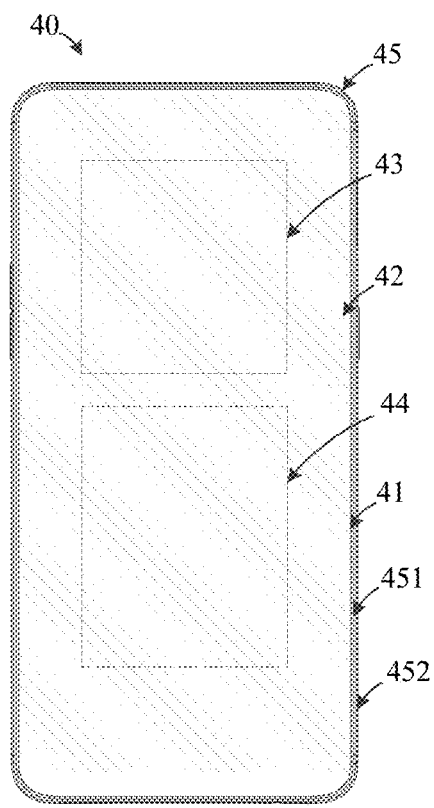
FIG. 4 is another structural schematic view of an electronic device according to embodiments of the present application.

It should also be noted that in some embodiments, the display screen 12 can also be configured as a full-screen structure without a non-display area, and functional components such as the distance sensor, the ambient light sensor and so on can be set below the display screen or at other positions. Specifically, please refer to FIG. 4, which is another structural view of the electronic device provided by the embodiments of the present application. The electronic device 40 can include a display 42, a cover plate 41, a printed circuit board 43, a battery 44, and a housing 45. Wherein, the display screen 42 covers the housing 45 without a non-display area. The cover plate 41 is suitable for the size of the display screen 42. It should be noted that the housing 45 can be referred to the above housing 15, the printed circuit board 43 can be referred to the above printed circuit board 13, and the battery 44 can be referred to the above battery 14, and details will not be discussed here.

It can be understood that, for the convenience of users, the electronic device can be equipped with front-facing camera and rear-facing camera, which is convenient for users to take photos, for example, please refer to FIG. 1. However, in the actual production process, the built-in front-facing camera and rear-facing camera of the electronic device will occupy a large space of electronic device, resulting in a waste of space and high cost. In some embodiments, a movable camera can be provided on the electronic device, and when a front-facing camera is required, the camera can be moved to the front of the electronic device; when a rear-facing camera is required, the camera can be moved to the back of the electronic device. It can be understood that the movable camera can be combined with FIG. 1 to FIG. 4, and will not be illustrated here one by one. The following describes in detail that the electronic device has a movable camera.

Figure 5:
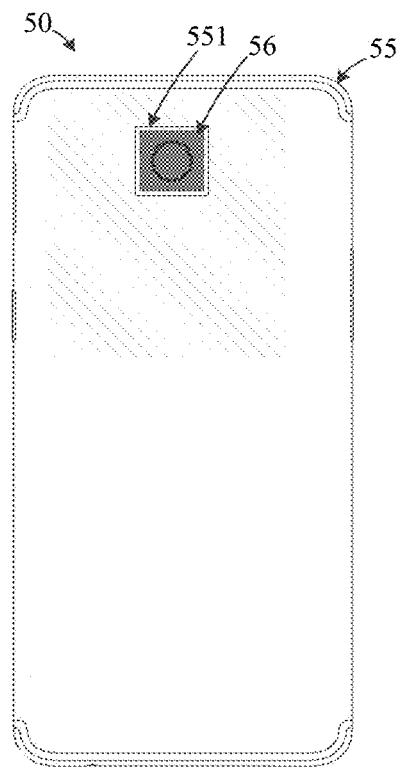
FIG. 5 is another structural schematic view of an electronic device according to embodiments of the present application.

In some embodiments, please refer to FIG. 5, which is another structural view of the electronic device provided in the embodiments of the present application. The difference between the electronic device in FIG. 5 and the electronic device in FIG. 1 is that the electronic device 50 in FIG. 5 includes a movable camera module 56.

In some embodiments, the electronic device 50 defines a channel 551, the camera module 56 can be moved in the channel, and the camera module 56 can be moved from in the channel 551 to the outside of the electronic device 50, and the camera module 56 can also be moved into the channel 551 from the outside of the electronic device 50. It should be noted that the camera module 56 can be completely accommodated in the channel 551 or partially exposed in the channel. It should also be noted that the camera module 56 can be completely pushed out of the channel 551, and the camera module 56 can be placed on the outside of the electronic device 50, or only a part of the camera module 56 can be pushed out of the electronic device 50, and a part of the camera module 56 can be kept inside the electronic device 50.

In some embodiments, the channel 551 can be formed along a direction from a non-display surface of the electronic device 50 toward the inside of the electronic device 50, and the non-display surface of the electronic device 50 can be referred to a surface shown in FIG. 1. It should be noted that the channel 551 can also be formed along a direction from the display surface of the electronic device 50 toward the inside of the electronic device 50, and the display surface of the electronic device 50 can refer to FIG. 1, FIG. 2, FIG. 3 or FIG. 4.

In some embodiments, the channel 551 may be formed along a direction from the periphery of the electronic device 50 toward the inside of the electronic device 50, such as along a direction from the top of the electronic device 50 toward the inside of the electronic device 50.

Wherein, the electronic device 50 also includes a housing 55, the housing 55 can be referred to the above, and details will not be described here. It should be noted that the channel 551 can be directly formed on the housing 55, that is, the housing 55 defines the channel 551. Optionally, the channel is defined along a direction from the rear cover of the housing toward the inside of the electronic device.

Figure 6:
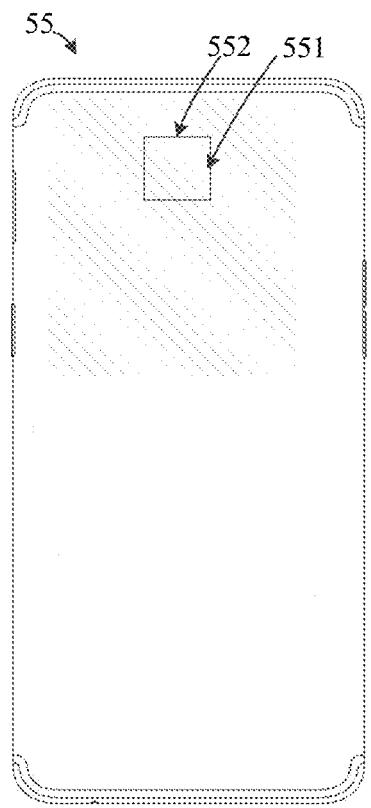
FIG. 6 is a structural schematic view of a housing according to embodiments of the present application.

In some embodiments, please refer to FIG. 6, which is the structural view of the housing provided in the embodiments of the present disclosure. The housing 55 can define at least one channel 551, and it is illustrated here as an example that the housing 55 defines one channel 551. It should be noted that the housing 55 may also not be limited to define one channel 551. The housing 55 has a side wall 552 at a position of the channel 551, and the side wall 552 is around the channel 551. When the camera module 56 is placed in the channel 551, the periphery of the camera module 56 is surrounded by the side wall 552. In some embodiments, the side wall 552 surrounds to form a rectangular structure, and it should be noted that the side wall 552 can also surrounds to form a cylinder structure, a circular table structure, or other regular structure, or other irregular structure.

In some embodiments, the camera module 56 can include only one camera, and the camera module 56 may also include two cameras, and the camera module 56 may further include a camera and a fill light, and the camera module 56 may also include a camera and a handset and so on. It should be noted that the camera module 56 includes a camera, and other functional components can be installed on the camera module 56 to form a functional component together with the camera. In the embodiment of the present disclosure, the camera module 56 including at least one camera is used as an example for description.

Figure 7:
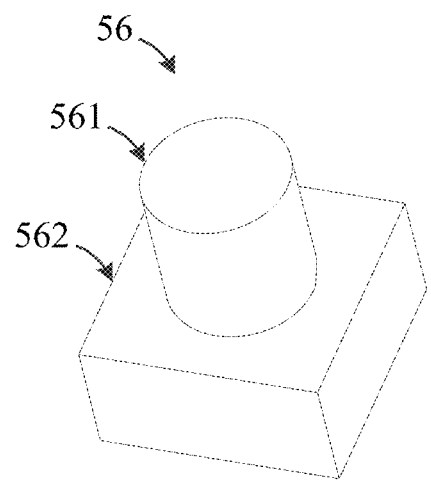
FIG. 7 is a structural schematic view of a camera in a camera module according to embodiments of the present application.

Please refer to FIG. 7, which is the structural view of the camera in the camera module provided in the embodiments of the application. The camera 56 can include a lens 561 and a base 562, the lens 561 is mounted on the base 562, and the base 562 can be connected with the housing 55. In some embodiments, the camera module can be formed by integrating a fill light, a handset and other components on the base 562. It also possible for two lenses to share the same base. There are no more examples here.

Figure 8:
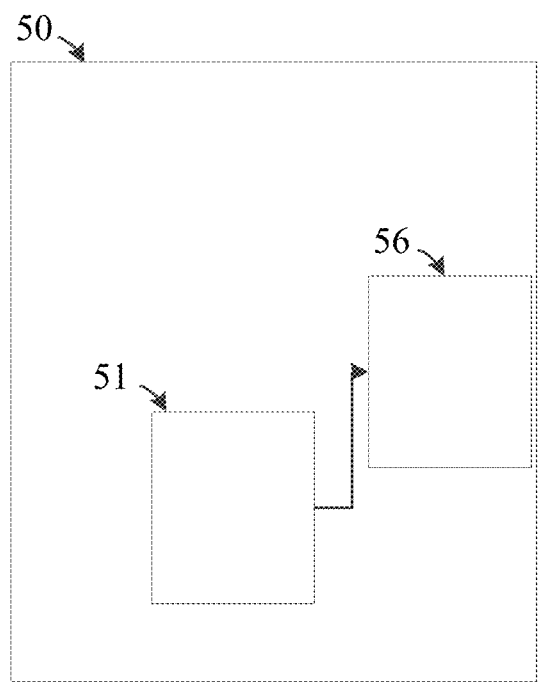
FIG. 8 is a state schematic view of an electronic device according to embodiments of the present application.

In some embodiments, please refer to FIG. 8, which is the state view of the electronic device provided in the embodiments of the present disclosure. FIG. 8 shows a state where the camera module 56 is inside of the electronic device 50. The electronic device 50 can also include a driving device 51, the driving device 51 can be installed inside the housing 55 of the electronic device 50 and engaged with the camera module, and the driving device 51 can drive the camera module 56 from the inside of the electronic device 50 to the outside of the electronic device 50 through the channel 551. The driving device 51 can also drive the camera module 56 from the outside of the electronic device 50 to the inside of the electronic device 50 through the channel 551.

Figure 9:
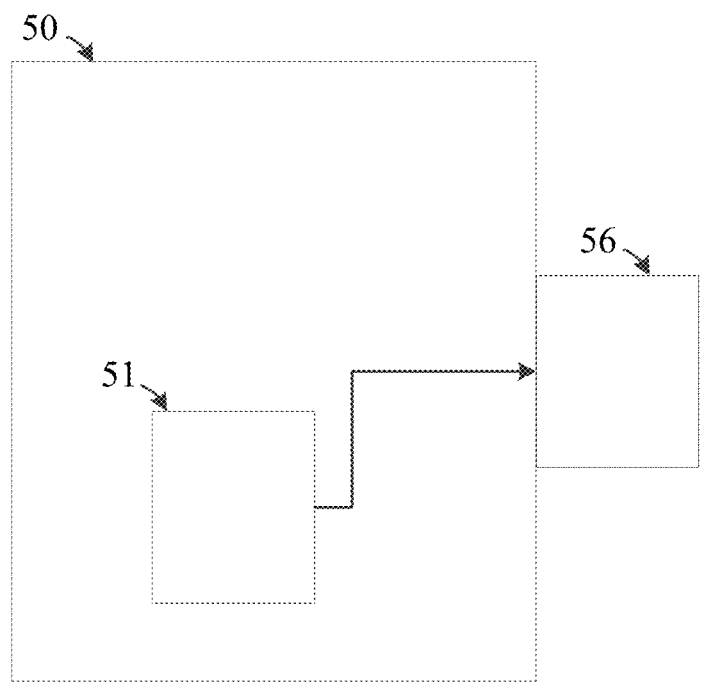
FIG. 9 is another state schematic view of an electronic device according to embodiments of the present application.

Please refer to FIG. 9, which is another state view of the electronic device provided in the embodiments of the present disclosure. FIG. 9 shows a state where the camera module 56 is outside of the electronic device 50. In actual use, the state in which the camera module 56 is located inside of the electronic device 50 is defined as an initial state. When the camera module 56 is need to use, the camera module 56 can be positively driven by the driving device 51 to move towards the outside of the electronic device 50 along the channel 551. When the camera module 56 is located outside the electronic device 50 and is not used, the camera module 56 can be reversely driven by the driving device 51 to move towards the inside of the electronic device 50 along the channel 551 for being accommodated in the channel 551.

In some embodiments, the driving device can be implemented by a driving motor directly driving the camera module 56.

In the actual production process, in order to reduce the driving device occupying the internal space of the electronic device, the driving device is getting smaller and smaller. The camera module 56 can not only include camera, but also can include components such as a flash, the handset and the sensor. The volume and weight of the camera module 56 are increasing, so that the driving force of the driving device is insufficient to drive the camera module 56. For this reason, the present application is that the applicant has designed a driving device for driving the camera module to have enough driving force to drive the camera module on the basis of miniaturization. The details are as follows.

Figure 10:
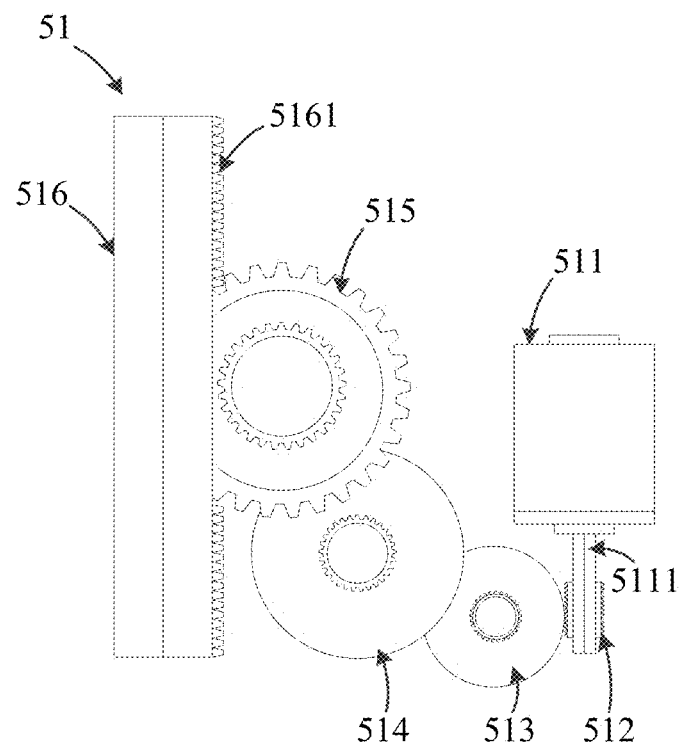
FIG. 10 is a structural schematic view of a driving device according to embodiments of the present application.

Please refer to FIG. 10, which is the structural view of the driving device provided in the embodiments of the disclosure. The drive device 51 can include a driving motor 511, a driving gear 512, a first transmission gear 513, a second transmission gear 514, a driven gear 515, and a driving board 516. It should be noted that in the description of the application, the terms "first" and "second" are only used for descriptive purposes, and cannot be understood as indicating or implying relative importance or implying the number of indicated technical features.

Wherein, the driving motor 511 includes an output shaft 5111. The driving motor 511 can be electrically connected to the printed circuit board of the electronic device 50. The printed circuit board can include a driving circuit by which the driving motor can be controlled. The driving motor can also be directly controlled by the processor of the electronic device 50.

In some embodiments, a diameter of the driving motor 511 can be 5 mm, and the driving motor 511 can realize a miniaturized structure to reduce the occupation of the internal space of the electronic device. It should be noted that the diameter of the driving motor 511 is not limited to this, for example, the diameter of the driving motor is greater than 4.8 and less than 5.2 mm.

Wherein, the driving gear 512 is mounted on the output shaft 5111 and can rotate following the rotation of the output shaft 5111.

Wherein, the first transmission gear 513 is meshed with the driving gear 512. In some embodiments, the first transmission gear 513 can be directly meshed with the driving gear 512, and the first transmission gear 513 can be directly driven by the driving gear 512 to rotate. It should be noted that the first transmission gear 513 can also be meshed with the driving gear 512 through a worm. Specifically, for example, the first transmission gear 513 is fixedly connected with a worm, and the worm is meshed with the driving gear 512. In some embodiments, a diameter of the first transmission gear 513 is greater than a diameter of the driving gear 512. In some embodiments, the diameter of the first transmission gear 513 can be 2 mm. It should be noted that the diameter of the first transmission gear 513 is not limited to this, for example, the diameter of the first transmission gear is greater than 1.8 mm and less than 2.2 mm. The driving gear 512 has a small diameter, which is convenient to be mounted on the output shaft of the driving motor 511 and to be directly driven by the driving motor 511.

Wherein, the second transmission gear 514 is meshed with the first transmission gear 513. In some embodiments, the second transmission gear 514 can directly be meshed with the first transmission gear 513, and the second transmission gear 514 is directly driven to rotate by the first transmission gear 513. In some embodiments, a diameter of the second transmission gear 514 is greater than the diameter of the first transmission gear 513. In some embodiments, the diameter of the second transmission gear 514 can be 4 mm. It should be noted that the diameter of the second transmission gear 514 is not limited to this, for example, the diameter of the second transmission gear is greater than 3.8 mm and less than 4.2 mm.

Wherein, the driven gear 515 is meshed with the second transmission gear 514. In some embodiments, the driven gear 515 can be directly meshed with the second transmission gear 514, the driven gear 515 can be directly driven by the second transmission gear 514 to rotate. In some embodiments, a diameter of the driven gear 515 is greater than the diameter of the second transmission gear 514. In some embodiments, the diameter of the driven gear 515 can be 6 mm. It should be noted that the diameter of the driven gear 515 is not limited to this, for example, the diameter d3 of the driven gear is greater than 5.8 mm and smaller than 6.2 mm.

Wherein, the driving board 516 is meshed with the driven gear 515. In some embodiments, the driving board 516 includes a rack 5161 formed on one side of the driving board 516, and the driven gear 515 can be meshed with the rack 5161. During the rotation of the driven gear 515, the rack 5161 can be directly driven by the driven gear 515 to move the driving board 516. The driving board 516 is placed in the channel 551, and the driving board 516 can move along the channel 551. The driving board 516 can drive the camera module 56 to the outside of electronic device or drive the camera module 56 from the outside of the electronic device 50 to the inside of the electronic device 50.

In the actual driving process, the driving motor 511 is energized, and the driving motor 511 drives its output shaft 5111 to rotate in a first direction, such as a positive rotation, to sequentially drive the driving gear 512, the first transmission gear 513, the second transmission gear 514, and the driven gear 515 to rotate; both of the rack 5161 and the driving board 516 are driven to move by the driven gear 515 during the rotation, and the driving board 516 pushes the camera module 56 from the inside of the electronic device 50 to the outside. When the driving motor 511 drives its output shaft 5111 to rotate in a second direction, such as in a reverse rotation, the driving gear 512, the first transmission gear 513, the second transmission gear 514 and the driven gear 515 are sequentially driven to rotate; both of the rack 5161 and the driving board 516 are driven to move by the driven gear 515 during the rotation process, and the driving board 516 pulls the camera module 56 from the outside to the inside of the electronic device 50.

It can be seen from the above that the diameters of the driving gear 512, the first transmission gear 513, the second transmission gear 514 and the driven gear 515 gradually increase in sequence, and the small diameter of the driving gear 512 can meet the demand of miniaturization of the driving motor. The small-diameter driving gear 512 is fitted to a miniaturized driving motor 511. The diameter of the driven gear 515 is large, the meshing range between the driven gear 515 and the driving board 516 can be increased as required during the meshing process between the driven gear 515 and the driving board 516, that is, the range of movement of the driving board 516 can be increased as required, for example, the range of movement of the driving board 516 can be increased from 1 cm to 2 cm or 3 cm and so on. Thus, the camera module with an increased volume or/and weight can be driven by gradually increasing the diameters of the driving gear 512, the first transmission gear 513, the second transmission gear 514 and the driven gear 515 in sequence. According to the above settings, the driving device can not only produce enough driving force, but also can adapt to the size of the camera module.

In some embodiments, the first transmission gear 513, the second transmission gear 514, and the driven gear 515 are located between the driving motor 511 and the driving board 516. The first transmission gear 513, the second transmission gear 514, and the driven gear 515 are arranged in a direction inclined to the driving board 516. In some embodiments, the axes of the first transmission gear 513, the second transmission gear 514, and the driven gear 515 are connected to form an arc-shaped structure, for example, an arc line segment can be formed. The driving motor 511 can be located in the concave position of the arc-shape structure. One side of the driving motor 511 is surrounded by the first transmission gear 513, the second transmission gear 514 and the driven gear 515, so that the first transmission gear 513, the second transmission gear 514, the driven gear 515 and the driving motor 511 are closely mounted to each other and occupy less space.

It should be noted that the axes of the first transmission gear 513, the second transmission gear 514 and the driven gear 515 can also form a linear structure, for example, a straight line segment can be formed.

In some embodiments, the projection formed by the driving motor 511 on the driving board 516 is located in the projection formed on the driving board 516 by both the second transmission gear 514 and the driven gear 515, so that the first transmission gear 513, the second transmission gear 514, the driven gear 515 and the driving motor 511 are more closely mounted to each other and occupy less space.

In some embodiments, the driving motor 511 is parallel to the driving board 516. Thus, the space occupied by the driving motor 511 and gears can be further reduced.

The above embodiments of the present application can not only realize the miniaturization of the driving motor, but also have enough driving force to drive the camera module to move through the cooperation of the driving motor 511 and multiple gears; moreover, the driving motor 511 and the multiple gears can be closely matched with each other to reduce the occupancy rate of the space of the electronic device. Specifically, the space occupied by the electronic device in a horizontal direction is small, and the space in a vertical direction of the electronic device is not additionally occupied. It should be noted that the arrangement of the driving motor 511, the first transmission gear 513, the second transmission gear 514, and the driven gear 515 is not limited to this.

Figure 11:
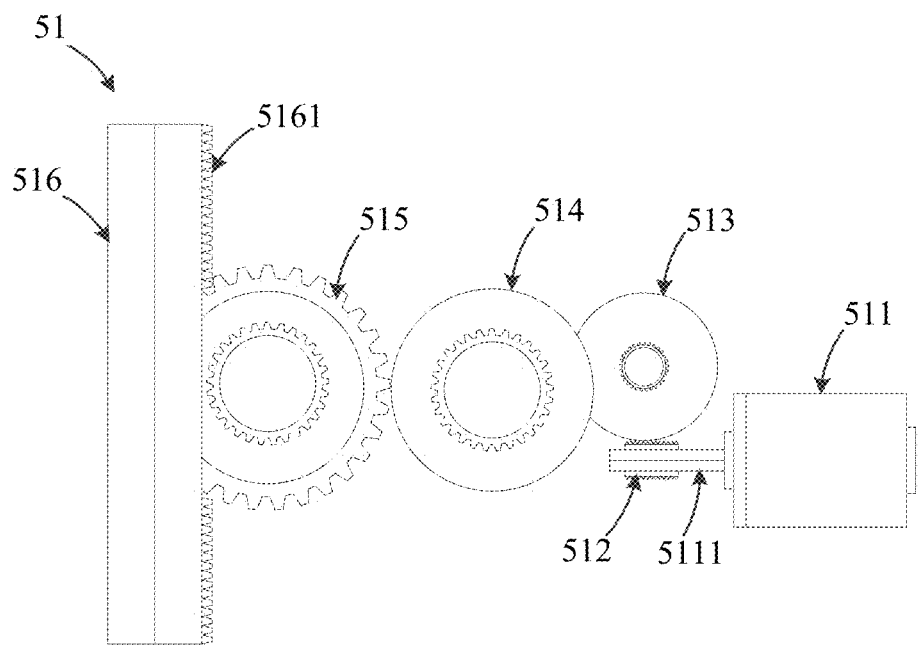
FIG. 11 is another structural schematic view of a driving device according to embodiments of the present application.

For example, please refer to FIG. 11, which is another structural view of the driving device provided in the embodiments of the present application. The difference between the driving device in FIG. 11 and FIG. 10 is that the driving motor 511 is perpendicular to the driving board 516, and the first transmission gear 513, the second transmission gear 514, and the driven gear 515 are arranged in a direction perpendicular to the driving board 516. The driving motor 511, the first transmission gear 513, the second transmission gear 514, and the driven gear 515 are arranged in order. For example, the driving motor 511, the first transmission gear 513, the second transmission gear 514, and the driven gear 515 are sequentially arranged in the horizontal direction of the electronic device in sequence, which can reduce the occupation of the vertical space of the electronic device and increase the size of the battery.

Optionally, as shown in FIG. 11, the first transmission gear 513, the second transmission gear 514, and the driven gear 515 are located on the same side of the driving gear 512, the axes of the first transmission gear 513, the second transmission gear 514, and the driven gear 515 are parallel, and the axis of the driving gear 512 is perpendicular to the axes of the first transmission gear 513, the second transmission gear 514, and the driven gear 515, and the intervals between the axes of the first transmission gear 513, the second transmission gear 514, and the driven gear 515 are sequentially increased.

Figure 12:
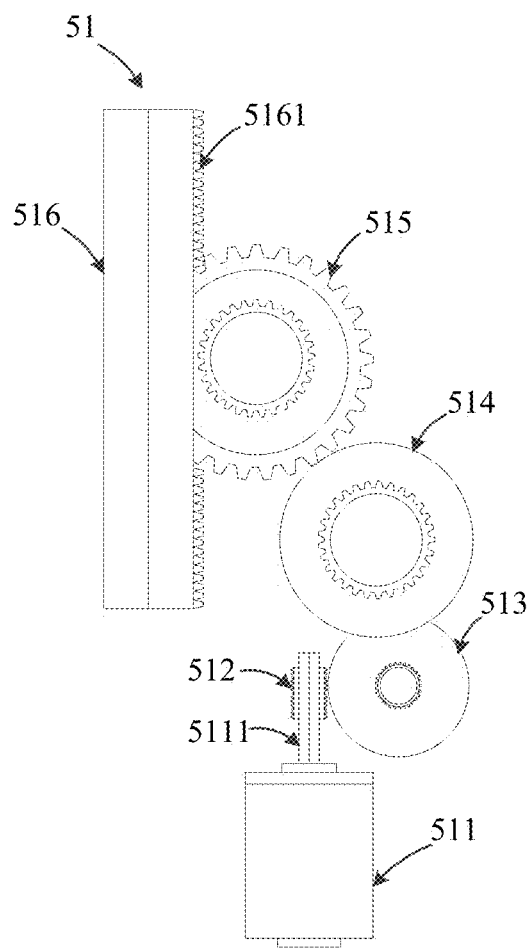
FIG. 12 is another structural schematic view of a driving device according to embodiments of the present application.

For another example, please refer to FIG. 12, which is another structural view of the driving device provided in the embodiments of the present application. The difference between the driving device of FIG. 12 and FIG. 10 and FIG. 11 is that the driven gear 515 and the driving board 516 are arranged side by side with in a first direction, and the driven gear 515, the first transmission gear 513, the second transmission gear 514 and the driving board 516 are arranged side by side with the driving motor 511 in a second direction, and the first direction is perpendicular to the second direction. For example, the driven gear 515 is arranged side by side with the driving board 516 in the horizontal direction, and the driven gear 515, the first transmission gear 513, the second transmission gear 514, and the driving board 516 are arranged side by side with the driving motor 511 in the vertical direction.

In some embodiments, the driven gear 515, the first transmission gear 513, the second transmission gear 514 and the driving motor 511 can be sequentially arranged in the vertical direction. The driving motor 511 can be extended vertically toward the electronic device, for example, it can be directly integrated on the printed circuit board, so as to reduce the space occupied of the driving device in the horizontal direction of the electronic device. In some embodiments, the camera module and the driving device can be located at a middle position of one end of the electronic device. It should be noted that both ends of the end of the electronic device are generally provided with an antenna structure. In the embodiment of the present application, the driving device extends toward the vertical direction of the electronic device, and reduces the occupation of the horizontal space, which can increase the clearance area of the antenna structure and improve the signal receiving and transmitting strength of the antenna structure.

The above embodiments of the application use a driven gear, two transmission gears, a driving gear and a driving motor cooperate to drive the driving board to move, and then drive the camera module to move through the driving board, so that the camera module can be pushed out to the electronic device, or the camera module located outside the electronic device can be pulled to the inside of the electronic device. The diameters of the driven gear, the second transmission gear, the first transmission gear, and the driving gear are sequentially reduced, which can increase the torque of the driving motor to drive the driving board, increase the force, and reduce the moving speed of the driving board.

It should be noted that in some other embodiments, the driving gear can also be used to drive the rack directly. Specifically, the driving gear is fixed on the output shaft of the driving motor and meshed with the rack of the driving board, and directly drives the rack by the driving gear to move the driving board. In other embodiments, a driving gear and a driven gear can also be used to drive the rack. Specifically, the driving gear is fixed on the output shaft of the driving motor and the driving gear is meshed with the driven gear, the driven gear is meshed with the rack of the driving board. The rack is driven by the driving gear and the driven gear to make the driving board move. In other embodiments, a driving gear, a transmission gear and a driven gear can be used to drive the rack together. It should also be noted that the number of transmission gears is not limited to this, for example, the number of transmission gears is three or more.

Figure 13:
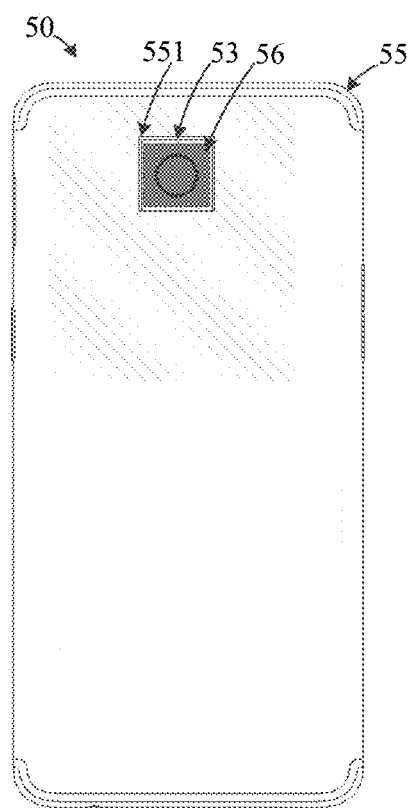
FIG. 13 is another structural schematic view of an electronic device according to embodiments of the present application.

In some embodiments, in order to improve the waterproof performance of the electronic device 50, a waterproof gasket can be provided at the position of the channel 551. Specifically, please refer to FIG. 13, which is another structural view of the electronic device provided in the embodiments of the application. The electronic device 50 can also include a waterproof gasket 53 disposed on the side wall 552. During the movement of camera module 56 in channel 551, the friction force will be increased due to the waterproof gasket 53. In the embodiments of the present application, the diameters of the driven gear 515, the second transmission gear 514, the first transmission gear 513 and the driving gear 512 decrease in order so as to increase the torque of the driving motor 511 to drive the driving board and the driving force to push camera module 56.

Optionally, the waterproof gasket is disposed on a side of the side wall 552 corresponding to the channel 551, the waterproof gasket is between the camera module 56 and the side wall 552 when the camera module 56 is in the channel 551.

In addition, in the actual production process of the embodiments of the present disclosure, by setting the waterproof gasket 53 at the position of the channel 551 and driving the driving board through the driving device, the driving board moves along the waterproof gasket to make the driving board move more evenly and stably, so that the camera module can move stably and focus easily. At the same time, it can protect the camera module and prevent the camera module from moving too fast or unstable to damage.

Wherein, the electronic device 50 can also include a display screen, a cover plate and a battery. For details, which will not be described here again, please refer to the above.

It can be known from the above that in order to improve the waterproof performance of the embodiments of the application, the waterproof gasket is provided at the position of the channel. Since the waterproof gasket increases the friction force during the movement of the camera module and the driving board, multiple gears in the above driving device can be used to be meshed with each other to increase the torque in the embodiments of the present application, so as to drive the camera module movement more evenly and stably. Thus, it not only improves the overall waterproof performance of the electronic device, but also drives the camera module to be more stable. The service life the electronic device is improved, and it is more convenient for users to take photos.

Figure 14:
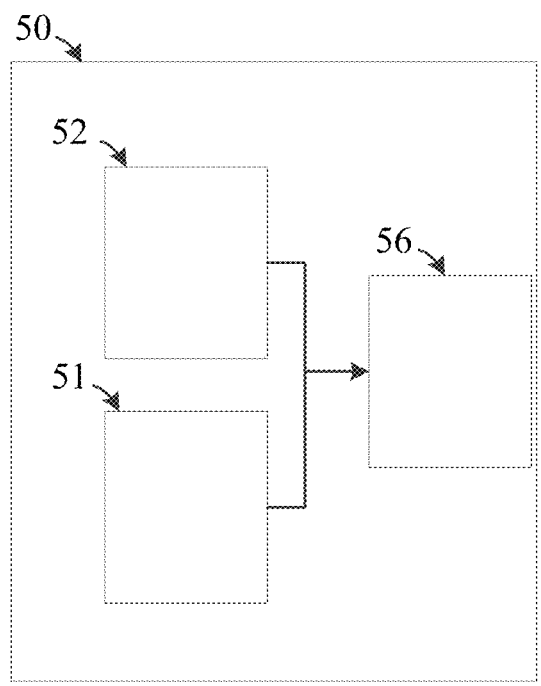
FIG. 14 is another structural schematic view of an electronic device according to embodiments of the present application.

In some embodiments, the electronic device 50 can also include a moving device, the moving device can move the camera module to an outer periphery of the electronic device. Specifically, please refer to FIG. 14, which is another state view of the electronic device provided by the embodiments of the present disclosure. The electronic device 50 has a driving device 51, a moving device 52, and a camera module 56. Among them, the camera module 56 can refer to the above, and will not be described here.

Figure 15:
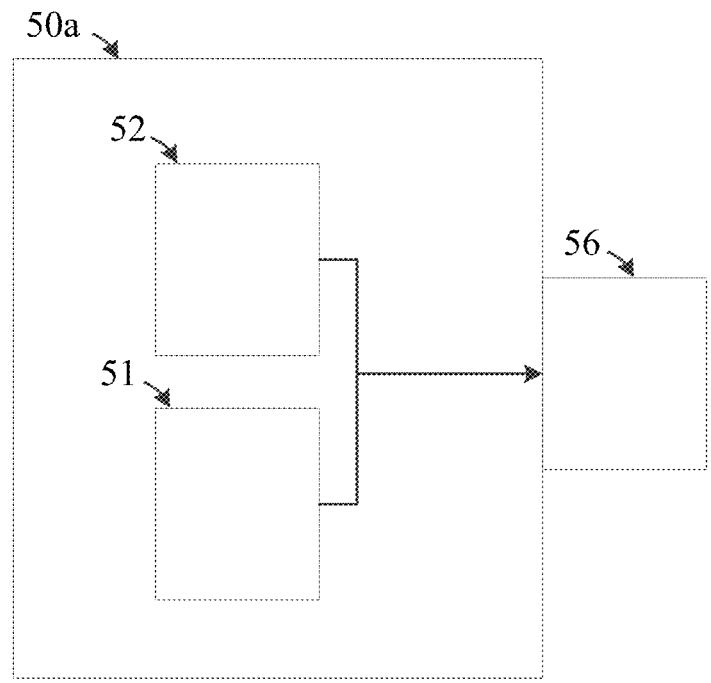
FIG. 15 is another structural schematic view of an electronic device according to embodiments of the present application.

Wherein, the driving device 51 can push the camera module 56 from the inside of the electronic device 50 to the outside of the electronic device 50. For details, please refer to FIG. 15, which is another state view of the electronic device provided in the embodiments of the disclosure. The camera module 56 is located outside the electronic device 50. For details, which will not be repeated here, please refer to the above content.

Figure 16:
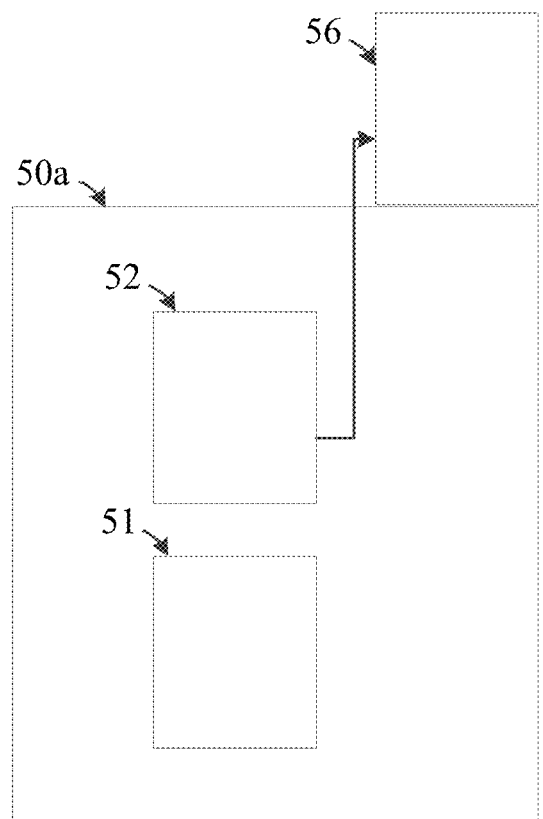
FIG. 16 is another structural schematic view of an electronic device according to embodiments of the present application.

Wherein, the moving device 52 is connected between the housing 55 and the camera module 56. The moving device 52 can move the camera module 56 outside the electronic device 50 to the outer periphery of the electronic device 50. Further, the moving device 52 can translate the camera module 56, or rotate and flip the camera module 56. For example, please refer to FIG. 16, which is another state view of the electronic device provided in the embodiments of the present application. The camera module 56 is located the outer periphery of the electronic device 50. The moving device 52 can move the camera module 56 outside the electronic device 50 to the outer periphery of the electronic device 50, so that the user can take photos.

In some embodiments, the moving device 52 may be two or more interconnected link mechanisms, and the camera module 56 may be moved or rotated to the outside of the periphery of the electronic device 50 through the connection of the two or more link mechanisms.

In some embodiments, the moving device 52 can include a driving motor and a gearbox to move or rotate the camera module 56 to the outer periphery of the electronic device 50 by the function of the driving motor and the gearbox.

It should be noted that the above moving device 52 is a scheme for moving the camera module 56 in a direction perpendicular to the display screen of the electronic device 50. When the camera module 56 is pushed out from the periphery of the electronic device 50, the moving device 52 can rotate the camera module 56, such as rotating 90 degrees, 180 degrees and so on.

The electronic devices provided by the embodiments of the application have been described in detail above. Specific examples are used herein to explain the principles and implementation of the application. The descriptions of the above embodiments are only used to help understand the present application. At the same time, for those skilled in the art, according to the idea of the present disclosure, there will be changes in the specific implementation and scope of the present application. In summary, the content of this specification should not be construed as a limitation on this application.

What is claimed is:

1. An electronic device, comprising a camera module and a driving device, the electronic device defining a channel, and the driving device comprising:
    a driving board, fixedly connected with the camera module and comprising a rack;
    a driving motor, comprising a driving gear; and
    a driven gear, meshed with both of the driving gear and the rack, wherein a diameter of the driven gear is greater than a diameter of the driving gear; and
    wherein the driving device further comprises a first transmission gear and a second transmission gear, the first transmission gear is meshed with the second transmission gear, a diameter of the first transmission gear is smaller than a diameter of the second transmission gear, the first transmission gear is meshed with the driving gear, the diameter of the first transmission gear is greater than the diameter of the driving gear, the second transmission gear is meshed with the driven gear, and the diameter of the second transmission gear is smaller than the diameter of the driven gear; and
    wherein the driving motor is configured to drive the driving board to move along a direction from the channel to the outside of the electronic device through a rotation of the driving gear, a rotation of the first transmission gear, a rotation of the second transmission gear, and a rotation of the driven gear, thereby to drive the camera module from in the channel to the outside of the electronic device.

2. The electronic device of claim 1, wherein the first transmission gear, the second transmission gear and the driven gear each are located between the driving motor and the driving board.

3. The electronic device of claim 2, wherein the axes of the first transmission gear, the second transmission gear and the driven gear are arranged in an arc shape.

4. The electronic device of claim 3, wherein the driving motor is located in the concave position of the arc shape, and one side of the driving motor is surrounded by the first transmission gear, the second transmission gear and the driven gear.

5. The electronic device of claim 2, wherein the first transmission gear, the second transmission gear, and the driven gear are located on the same side of the driving gear, the axes of the first transmission gear, the second transmission gear, and the driven gear are parallel, and the axis of the driving gear is perpendicular to the axes of the first transmission gear, the second transmission gear, and the driven gear, and the intervals between the axes of the first transmission gear, the second transmission gear, and the driven gear are sequentially increased.

6. The electronic device of claim 1, wherein the diameter of the first transmission gear is greater than 1.8 mm and less than 2.2 mm, the diameter of the second transmission gear is greater than 3.8 mm and less than 4.2 mm, the diameter of the driven gear is greater than 5.8 mm and less than 6.2 mm, and the diameter of the driving motor is greater than 4.8 mm and less than 5.2 mm.

7. The electronic device of claim 1, wherein the electronic device comprises a side wall, the side wall is around the channel, the electronic device comprises a waterproof gasket, and the waterproof gasket is disposed on a side of the side wall corresponding to the channel, the waterproof gasket is between the camera module and the side wall when the camera module is in the channel.

8. The electronic device of claim 1, wherein the electronic device comprises a display screen, the driving device drives the driving board to move in a direction perpendicular to the display screen, and the channel is defined from the side opposite to the display surface of the display screen towards the display surface of the display screen.

9. The electronic device of claim 1, wherein the electronic device also comprises a moving device connected with the camera module, and the moving device is configured to move the camera module outside the electronic device to an outer periphery of the electronic device.

10. The electronic device of claim 1, wherein the electronic device comprises a display screen, and the driving device drives the driving board to move in a direction parallel to the display screen.

11. The electronic device of claim 1, wherein the electronic device further comprises a moving device connected with the camera module, and the moving device is configured to control the rotation of the camera module outside the electronic device.

12. The electronic device of claim 11, wherein the electronic device further comprises a display screen, a printed circuit board, a battery and a housing, the housing comprises a middle frame and a rear cover, the middle frame and the rear cover form a storage space, the display screen, the printed circuit board and the battery are received in the storage space, the channel is defined along a direction from the rear cover toward the inside of the electronic device.

13. The electronic device of claim 1, wherein a projection formed by the driving motor on the driving board is located in a projection formed by both the second transmission gear and the driven gear on the driving board.

14. An electronic device, comprising:
a housing, defining a channel;
a camera module, at least partially accommodated in the channel; and
a driving device, engaged with the camera module, the driving device, comprising:
a driving board, fixedly connected with the camera module and comprising a rack;
a driving motor, comprising a driving gear; and
a driven gear, meshed with both of the driving gear and the rack, wherein the driven gear and the driving board are arranged side by side in a first direction, the driven gear, the driving board and the driving motor are arranged side by side in a second direction, the first direction is perpendicular to the second direction, and a diameter of the driven gear is greater than a diameter of the driving gear;
wherein the driving device further comprises at least one transmission gear, the at least one transmission gear comprises a first transmission gear and a second transmission gear, the first transmission gear is meshed with the second transmission gear; a diameter of the first transmission gear is smaller than a diameter of the second transmission gear; the first transmission gear is meshed with the driving gear, and the diameter of the first transmission gear is greater than the diameter of the driving gear; the second transmission gear is meshed with the driven gear, and the diameter of the second transmission gear is smaller than the diameter of the driven gear, the first driving transmission gear, the second transmission gear and the driven gear are arranged in a direction parallel to the driving board;
wherein the driving motor is configured to drive the driving board to move along a direction from the channel to the outside of the electronic device through a rotation of the driving gear, a rotation of the first transmission gear, a rotation of the second transmission gear, and a rotation of the driven gear, thereby the camera module at least partially being driven to the outside of the electronic device.

15. The electronic device of claim 14, wherein the camera module comprises one or more cameras, the camera comprises a lens and a base, the lens is mounted on the base, and the base is connected with the housing.

16. The electronic device of claim 15, wherein the camera module further comprises a fill light and a handset, the fill light and the handset are integrated on the base.

17. The electronic device of claim 14, wherein a projection formed by the driving motor on a plane perpendicular to a lengthwise direction of the driving board is located in a projection formed on the plane by both the second transmission gear and the driven gear.

18. An electronic device, comprising:
a housing, defining a channel;
a camera module, at least partially accommodated in the channel; and
a driving device, engaged with the camera module, the driving device comprising:
a driving board, fixedly connected with the camera module, and comprising a rack;
a driving motor, comprising a driving gear; and a driven gear, meshed with both of the driving gear and the rack, wherein the driven gear is located between the driving board and the driving motor, the driving motor is perpendicular to the driving board, a diameter of the driven gear is greater than a diameter of the driving gear;

wherein the driving device further comprises at least one transmission gear, the at least one transmission gear comprises a first transmission gear and a second transmission gear, the first transmission gear is meshed with the second transmission gear, a diameter of the first transmission gear is smaller than a diameter of the second transmission gear, the first transmission gear is meshed with the driving gear, the diameter of the first transmission gear is greater than a diameter of the driving gear, the second transmission gear is meshed with the driven gear, and the diameter of the second transmission gear is smaller than a diameter of the driven gear; and the first transmission gear, the second transmission gear and the driven gear each are located between the driving motor and the driving board, and the first transmission gear, the second transmission gear and the driven gear are arranged in a direction perpendicular to the driving board; and wherein the driving motor is configured to drive the driving board to move along a direction from the channel to the outside of the electronic device through a rotation of the driving gear, a rotation of the first transmission gear, a rotation of the second transmission gear, and a rotation of the driven gear, thereby the camera module at least partially being driven to the outside of the electronic device.

19. The electronic device of claim 18, wherein a projection formed by the first transmission gear on the driving board is located in a projection formed by the second transmission gear on the driving board, and the projection formed by the second transmission gear is located in a projection formed by the driven gear on the driving board.

\* \* \* \* \*